United States Patent
Takami et al.

(10) Patent No.: US 8,280,468 B2
(45) Date of Patent: Oct. 2, 2012

(54) SUPERCONDUCTING MAGNET DEVICE FOR SINGLE CRYSTAL PULLING APPARATUS

(75) Inventors: Shohei Takami, Yokohama (JP); Tsutomu Shimonosono, Yokohama (JP); Tomoko Ota, Yokohama (JP); Yuuji Minemoto, Yokohama (JP); Yoshifumi Nagamoto, Yokohama (JP); Makoto Ushijima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 46 days.

(21) Appl. No.: 12/994,838

(22) PCT Filed: May 25, 2009

(86) PCT No.: PCT/JP2009/059539
§ 371 (c)(1),
(2), (4) Date: Nov. 26, 2010

(87) PCT Pub. No.: WO2009/145149
PCT Pub. Date: Dec. 3, 2009

(65) Prior Publication Data
US 2011/0077161 A1   Mar. 31, 2011

(30) Foreign Application Priority Data

May 26, 2008 (JP) ................... 2008-136515
Apr. 17, 2009 (JP) ................... 2009-100618

(51) Int. Cl.
*H01B 12/00* (2006.01)
(52) U.S. Cl. ..................... 505/211; 117/217
(58) Field of Classification Search .......... 117/217, 117/208; 505/163, 211, 879, 892, 894, 897
See application file for complete search history.

(56) References Cited

U.S. PATENT DOCUMENTS

| 4,565,671 A * | 1/1986 | Matsutani et al. ............ 117/217 |
| 6,011,810 A * | 1/2000 | Haller et al. ............... 372/45.01 |
| 7,000,408 B2 * | 2/2006 | Mitsubori ............................ 62/6 |
| 2004/0107894 A1 | 6/2004 | Shimonosono et al. |
| 2005/0166600 A1 | 8/2005 | Mitsubori |

FOREIGN PATENT DOCUMENTS

| JP | 10 007486 | 1/1998 |
| JP | 10 120485 | 5/1998 |
| JP | 11 176630 | 7/1999 |
| JP | 11 199366 | 7/1999 |
| JP | 11 199367 | 7/1999 |

(Continued)

OTHER PUBLICATIONS

Translation of JP10-120485.*

(Continued)

*Primary Examiner* — Colleen Dunn
(74) *Attorney, Agent, or Firm* — Oblon, Spivak, McClelland, Maier & Neustadt, L.L.P.

(57) ABSTRACT

A superconducting magnet device for a single crystal pulling apparatus is arranged outside a pulling furnace containing a crucible for melting a single crystal material therein so as to apply a magnetic field to the melted single crystal material. The superconducting magnet device for a single crystal pulling apparatus includes a cryostat containing a superconducting coil therein, and a refrigerator port arranged on the outer circumferential surface of the cryostat and provided with a cryogenic refrigerator that cools the superconducting coil. The cryogenic refrigerator is provided in a region of the outer surface region of the cryostat at which the intensity of the magnetic field generated by the superconducting coil is weak.

12 Claims, 7 Drawing Sheets

FOREIGN PATENT DOCUMENTS

| | | |
|---|---|---|
| JP | 2000 095597 | 4/2000 |
| JP | 2004 051475 | 2/2004 |
| JP | 2004 091240 | 3/2004 |
| JP | 2005 123313 | 5/2005 |

OTHER PUBLICATIONS

Translation of JP11-176630.*
Translation of JP11199367.*
Translation of JP2004-91240.*
International Preliminary Report on Patentability and Written Opinion issued Aug. 25, 2009, in PCT/JP2009/059539.
International Search Report issued Aug. 25, 2009 in PCT/JP09/059539 filed May 25, 2009.

* cited by examiner

SUPERCONDUCTING MAGNET DEVICE FOR SINGLE CRYSTAL PULLING APPARATUS

TECHNICAL FIELD

The present invention relates to a superconducting magnet device for a single crystal pulling apparatus that is used in a single crystal pulling apparatus for producing a single crystal (for example, a semiconductor single crystal).

BACKGROUND ART

There is known a single crystal pulling apparatus utilizing an MCZ (magnetic-field-applied Czochralski) method in which a crucible melting a single crystal material (particularly, a semiconductor single crystal material) is contained inside a pulling furnace, and a superconducting magnet device is disposed outside the pulling furnace. A magnetic field is applied to the single crystal material which is melted inside the crucible by the superconducting magnet device to thereby prevent convection of the melted single crystal material.

When producing a silicon single crystal using the MCZ method, in many cases, the shape and size of a super-conducting magnet device for applying a magnetic field is restricted in order to prevent mechanical interference with a pulling apparatus. In particular, relatively strict attention must be paid to the connection between the upper end face of the superconducting magnet device and the pulling apparatus main body (for example, pulling machine). Further, when taking into consideration the workability and safety of an operator performing operations on the upper end face, the arrangement of projecting parts such as a refrigerator and a current lead terminal requires a lot of attention.

Figure 13:
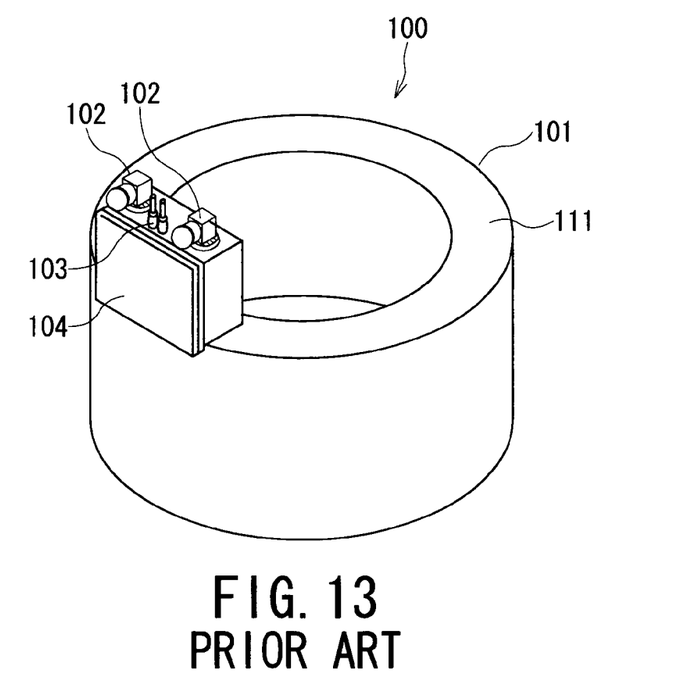
FIG. 13 is a perspective view that illustrates a conventional superconducting magnet device for a single crystal pulling apparatus.

According to a superconducting magnet device for a single crystal pulling apparatus 100 disclosed in Patent Document 1 (Japanese Patent Laid-Open Publication No. 2004-51475) shown in FIG. 13, a cryogenic refrigerator 102 and a current lead terminal 103 and the like that exist on a cylindrical cryostat 101 are arranged together on a refrigerator port 104 so as to avoid the interference with the pulling apparatus main body.

Figure 14:
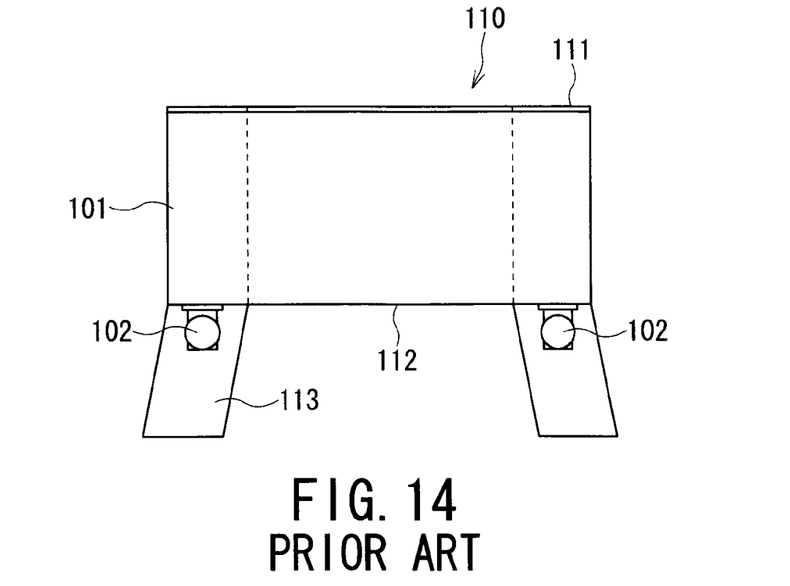
FIG. 14 is a perspective view that illustrates another conventional superconducting magnet device for a single crystal pulling apparatus.

Further, according to a superconducting magnet device for a single crystal pulling apparatus 110 disclosed in Patent Document 2 (Japanese Patent Laid-Open Publication No. 2000-114028) shown in FIG. 14, a cryogenic refrigerator 102 and a current lead terminal 103 are mounted on a lower end face 112 of a cylindrical cryostat 101 in a manner such that an upper end face 111 of the cryostat 101 forms completely flat surface. Patent Document 3 (Japanese Patent Laid-Open Publication No. 11-199366) also discloses a superconducting magnet device for a single crystal pulling apparatus of the same kind as that disclosed in Patent Document 2.

In comparison with the superconducting magnet device for a single crystal pulling apparatus 100 disclosed in the Patent Document 1, the aforementioned superconducting magnet device for a single crystal pulling apparatus 110 disclosed in the Patent Document 2 is superior with respect to interference with the pulling apparatus main body at the upper end face 111 of the cryostat 101 as well as the workability and safeness in working of the operator.

However, the cryogenic refrigerator 102 requires periodical maintenance, and it is necessary to secure a maintenance space of 800 mm or more in the vertical direction from the installation surface in order to withdraw the refrigerator. Therefore, according to the superconducting magnet device 110 disclosed in the Patent Document 2 in which the cryogenic refrigerator 102 is inserted from the lower end face 112 of the cryostat 101, leg portions 113 are provided to secure maintenance space on the lower end face 112.

In general, with a cylindrical superconducting magnet device for a single crystal pulling apparatus, after the superconducting magnet device is mounted to the single crystal pulling apparatus, the superconducting magnet device is raised and lowered in the vertical direction in order to adjust the magnetic field that is applied thereto. Therefore, if the overall height dimensions of the apparatus are large, the margin for adjustment of the magnetic field decreases.

DISCLOSURE OF THE INVENTION

The present invention has been made in consideration of the circumstances described above, and an object of the present invention is to provide a superconducting magnet device for a single crystal pulling apparatus that can suppress interference with a pulling apparatus and enhance workability and safeness in working of an operator on the apparatus, in addition to securing of a margin for adjusting an applied magnetic field.

In order to achieve the above object, the present invention provides a superconducting magnet device for a single crystal pulling apparatus that is arranged outside a pulling furnace containing therein a crucible for melting a single crystal material so as to apply a magnetic field to the melted single crystal material, the superconducting magnet device including: a cryostat that encloses a superconducting coil; a refrigerator port arranged on an outer surface of the cryostat; and a cryogenic refrigerator that cools the superconducting coil provided on the refrigerator port, wherein the cryogenic refrigerator is provided in a region of an outer surface region of the cryostat at which an intensity of a magnetic field generated by the superconducting coil is weak.

In a preferred example of the above described embodiment of the invention, the refrigerator port and the cryogenic refrigerator may be arranged within an area between an upper end face and a lower end face of the cryostat outer surface.

The cryogenic refrigerator may include a drive motor, and the drive motor is arranged in a magnetic field region in which modulation is not induced by a magnetic field generated by the superconducting coil inside the cryostat.

The refrigerator port may be arranged at a plurality of locations on the outer surface of the cryostat. In such case, the refrigerator ports may also be continuously arranged on the outer surface of the cryostat.

It may be preferred that the cryostat is a cylinder-shaped cylindrical cryostat or a rectangular parallelepiped-shaped split-type cryostat.

The superconducting coil inside the cryostat may be cooled to a cryogenic temperature by the cryogenic refrigerator via a heat transfer plate, or immersed in liquid helium that is filled in a coolant container inside the cryostat so as to be cooled to a cryogenic temperature by the cryogenic refrigerator.

It may be preferred that the superconducting coil inside the cryostat is immersed in liquid helium that is filled in a coolant container inside the cryostat so as to be cooled to a cryogenic temperature by the cryogenic refrigerator.

The superconducting coil may also be a pair of saddle-shaped superconducting coils, or a pair or a plurality of pairs of circular superconducting coils.

According to the present invention having the characteristic features mentioned above, since the refrigerator port including a cryogenic refrigerator is arranged on an outer surface of a cryostat, the upper end face of the cryostat is made to be flat. As a result, interference with a pulling apparatus can be suppressed, and workability and safeness in working of an operator on the apparatus can be enhanced. Further, a protruding portion such as a leg portion does not exist on a lower end face of the cryostat, and it is hence possible to set the entire height dimensions of the apparatus to a low level. Accordingly, a margin for adjusting a magnetic field that adjusts an applied magnetic field by raising and lowering the apparatus can be favorably secured.

The nature and further characteristic features of the present invention will be further apparent from the following description made with reference to the accompanying drawings.

MODE FOR EMBODYING THE INVENTION

Best modes for carrying out the present invention are described hereunder with reference to the accompanying drawings. It is further to be noted that, in the following description, terms a direction or a position, such as up or down and left or right, are used herein with reference to the illustration of the attached drawings or based on the actual installation state of a superconducting magnet device.

FIRST EMBODIMENT (FIG. 1 to FIG. 10)

Figure 1:
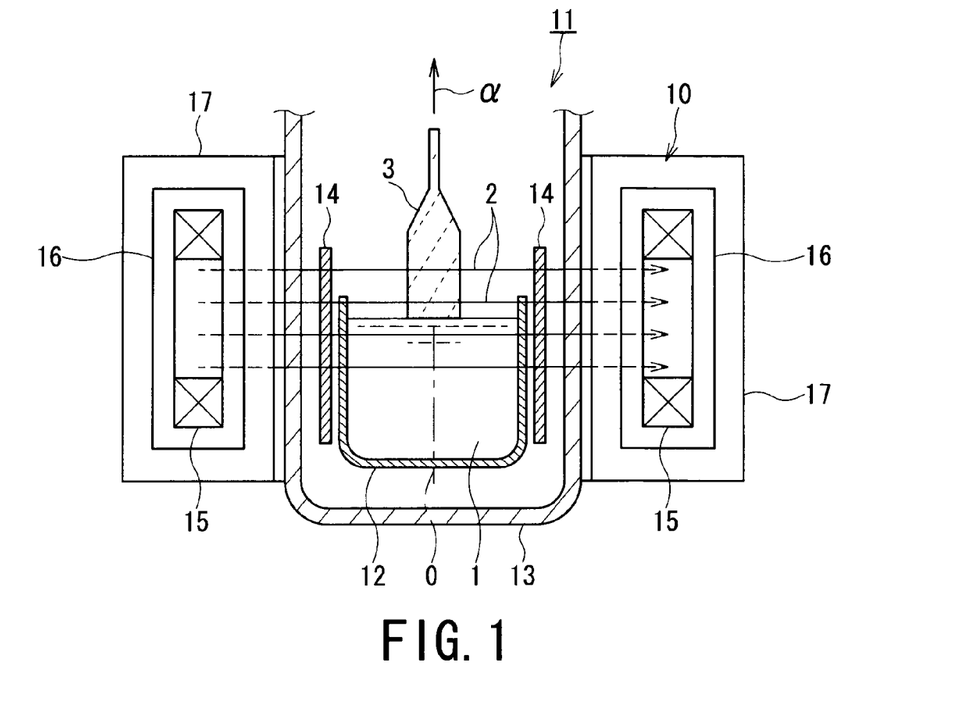
FIG. 1 is a cross-sectional side view of a first embodiment of the superconducting magnet device for a single crystal pulling apparatus according to the present invention together with one portion of a single crystal pulling apparatus.

As shown in FIG. 1, a single crystal pulling apparatus 11 includes a superconducting magnet device 10, which is disposed outside a pulling furnace 13 which contains a crucible 12 for melting a semiconductor single crystal material 1, and the so-called MCZ method (magnetic-field-applied Czochralski method) is applied to the single crystal pulling apparatus 11 by applying a unidirectional transverse magnetic field (indicated by lines of magnetic force 2 in FIG. 1) to the single crystal material 1 melted inside the crucible 12 to thereby prevent convection of the melted single crystal material 1 inside the crucible 12.

More specifically, in the single crystal pulling apparatus 11, the crucible 12 is contained in the pulling furnace 13 having an upper opening upper region, and a heater 14 for heating and melting the single crystal material 1 disposed inside the crucible 12 is arranged between the pulling furnace 13 and the crucible 12. The superconducting magnet device 10 provided with a pair of superconducting coils 15 (FIG. 3) is arranged outside the pulling furnace 13. Although not shown in the drawings, a pulling machine for pulling up a single crystal ingot 3 (described later) along a center line O of the crucible 12 is provided at the upper portion of the pulling furnace 13.

In a case when the single crystal ingot 3 is manufactured, the single crystal material 1 is first introduced into the crucible 12 and heated by the heater 14 so as to melt the single crystal material 1. A seed crystal, not shown, is downwardly inserted, for example, from an upper portion of the central portion of the crucible 12 into the melted single crystal material 1. The seed crystal is then pulled up in a pulling direction a at a predetermined speed by the pulling machine. In this manner, a crystal is grown in a boundary layer between a solid substance and a liquid substance to thereby generate the single crystal ingot 3.

During the operation mentioned above, in order to prevent convection of the melted single crystal material 1 inside the crucible 12, which is induced by heat of the heater 14, a current is passed to the superconducting coils 15 of the superconducting magnet device 10. The melted single crystal material 1 in the crucible 12 is subjected to a motion suppressing force (Lorenz force) by a transverse magnetic field (indicated by lines of magnetic force 2 in FIG. 1) generated by the superconducting coils 15, and the melted single crystal material 1 is slowly pulled up accompanying the operation to pull up the seed crystal without causing convection inside the crucible 12, thus producing the solid-state single crystal ingot 3.

Figure 2:
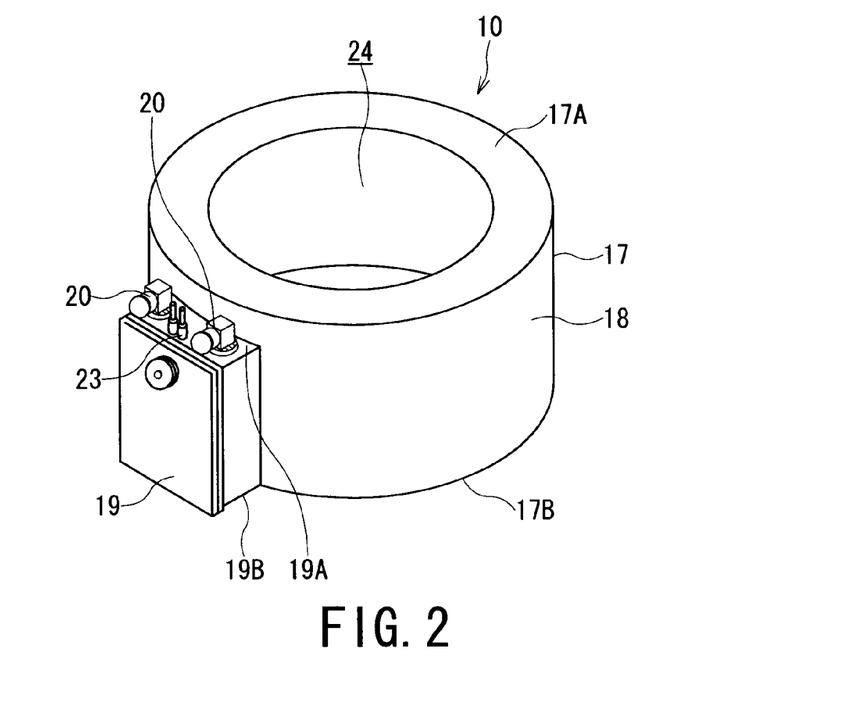
FIG. 2 is a perspective view illustrating the super-conducting magnet device shown in FIG. 1.
Figure 3:
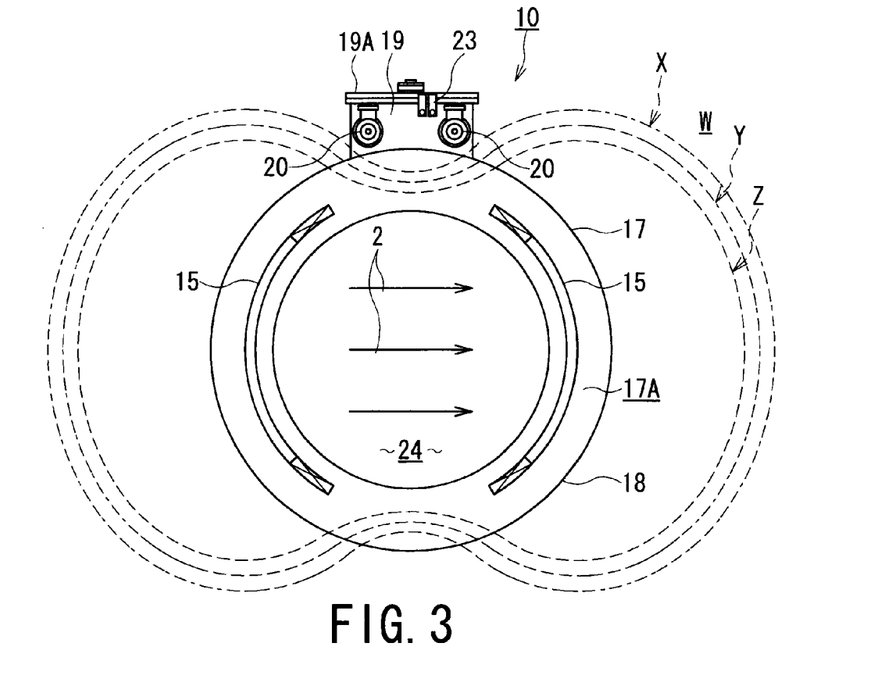
FIG. 3 is a plan view that illustrates, with solid lines, a superconducting coil in the superconducting magnet device shown in FIG. 2.
Figure 4:
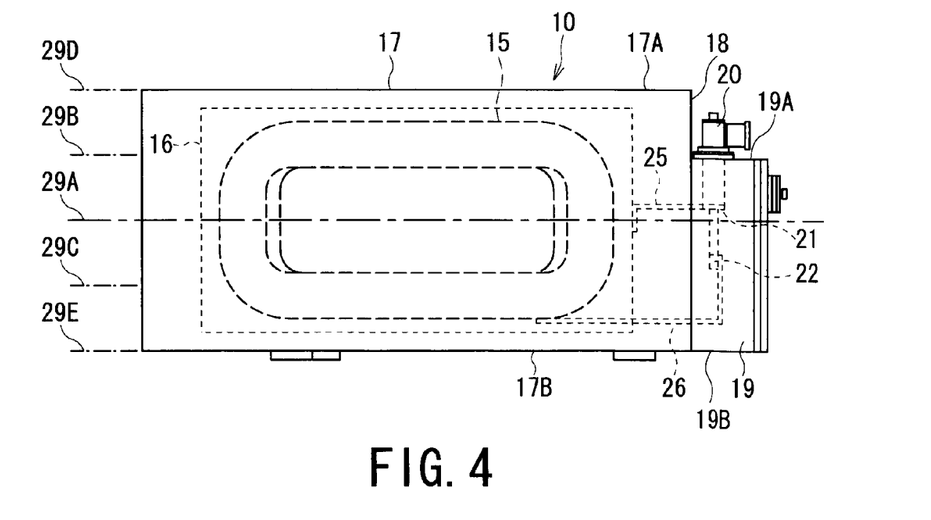
FIG. 4 is a side view that illustrates the superconducting magnet device shown in FIG. 3.

As shown in FIG. 2 to FIG. 4, the superconducting magnet device 10 includes a cryostat 17 that contains the superconducting coils 15 and radiation shields 16, and a single refrigerator port 19 that is arranged on an outer circumferential surface 18 of the cryostat 17 and includes a cryogenic refrigerator 20, a current lead terminal 23 and a valve, not shown.

The cryostat 17 is a cylindrical cryostat. A vacuum condition is maintained inside the cryostat 17 for thermal insulation. The radiation shield 16 covers the superconducting coils 15, respectively, inside the cryostat 17, and blocks heat radiation to the superconducting coils 15 from the outside of the cryostat 17. The superconducting coils 15 are a pair of saddle-shaped coils that are arranged facing each other through a bore portion 24 in the cryostat 17. The superconducting coils 15 generate transverse magnetic fields in the same (one) direction (represented by lines of magnetic force 2 in FIG. 3) inside the bore portion 24 of the cryostat 17.

The pulling furnace 13 and the crucible 12 are arranged inside the bore portion 24 of the cryostat 17.

Figure 7:
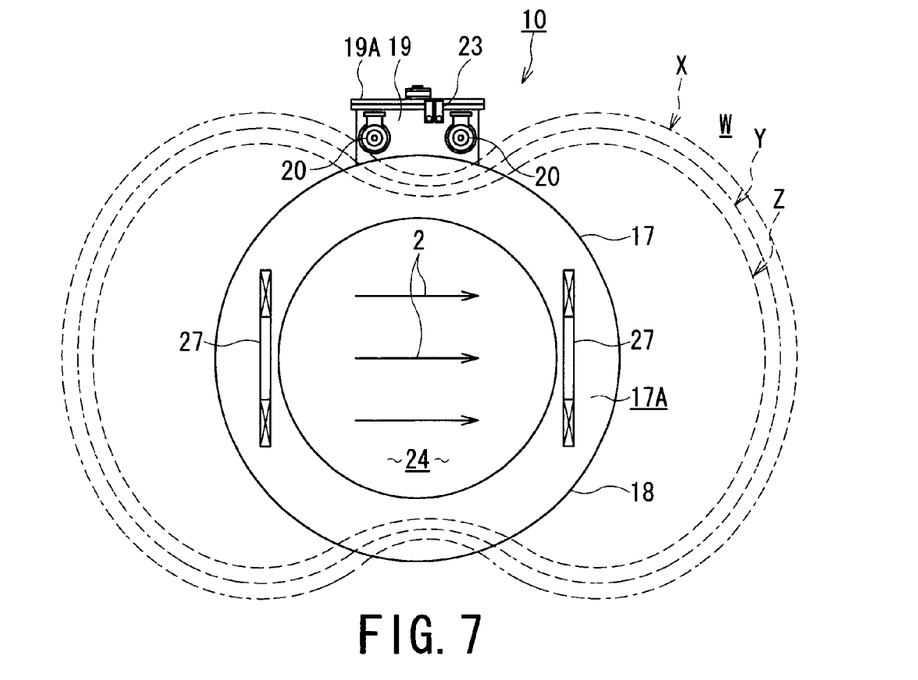
FIG. 7 is a plan view that illustrates, with solid lines, another example of a superconducting coil in the superconducting magnet device shown in FIG. 2.
Figure 8:
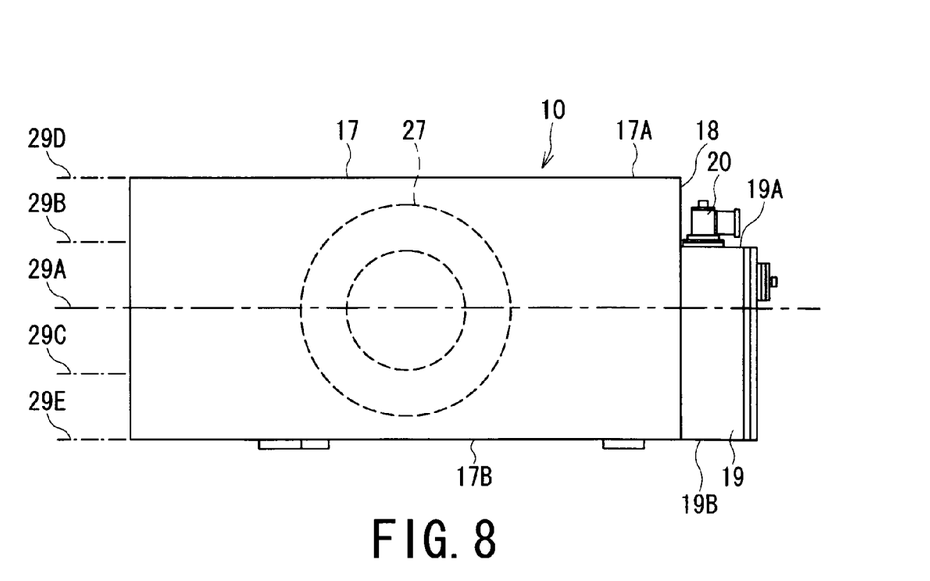
FIG. 8 is a side view that illustrates the superconducting magnet device shown in FIG. 7.
Figure 9:
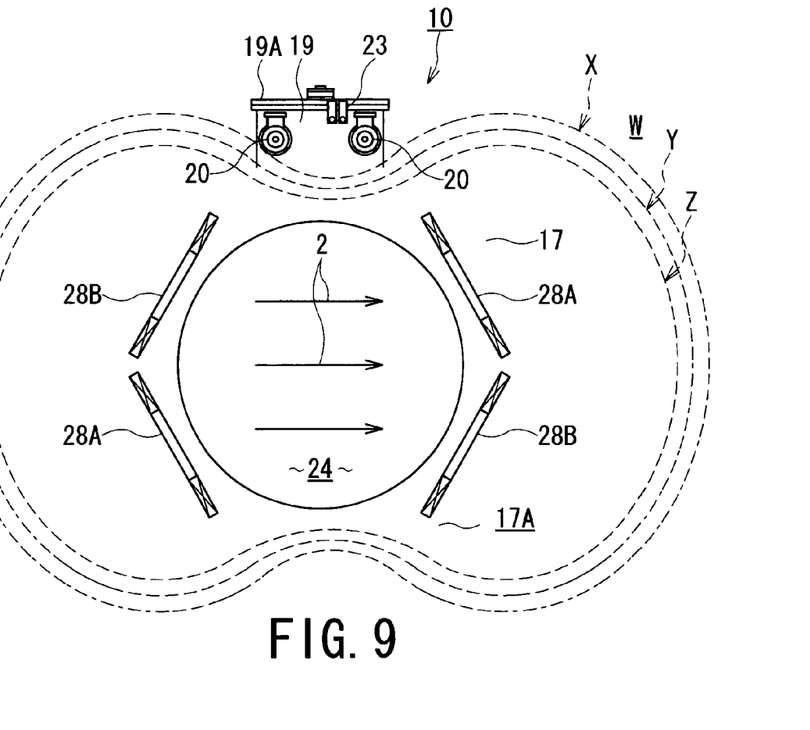
FIG. 9 is a plan view that illustrates, with solid lines, a further example of a superconducting coil in the superconducting magnet device shown in FIG. 2.
Figure 10:
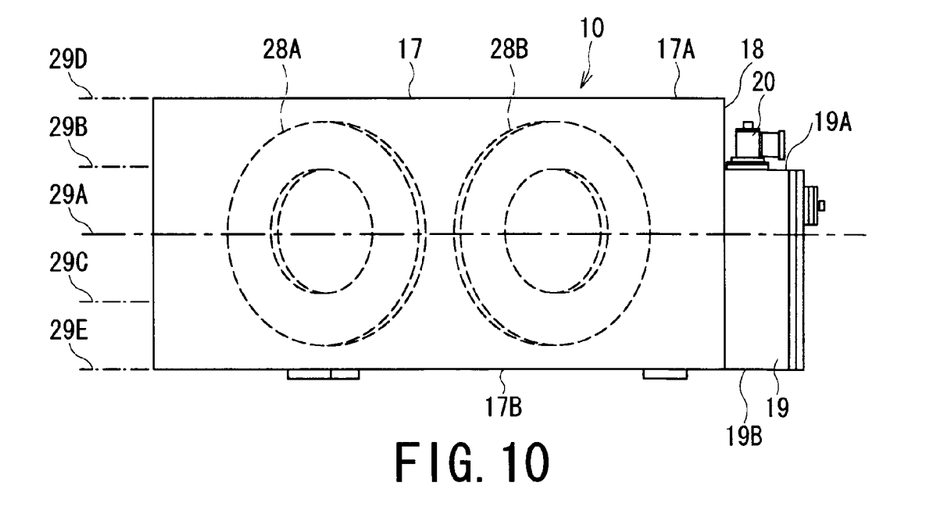
FIG. 10 is a side view that illustrates the superconducting magnet device shown in FIG. 9.

The superconducting coils that are enclosed by the cryostat 17 are not limited to saddle-shaped coils like the superconducting coils 15, and there may be adopted a pair of circular superconducting coils 27 that are disposed so as to face each other through the bore portion 24 of the cryostat 17 as shown in FIG. 7 and FIG. 8. Further, the superconducting coils inside the cryostat 17 may be a plurality of pairs (for example, two pairs) of superconducting coils 28A and 28B disposed so as to face each other, respectively, through the bore portion 24 of the cryostat 17 as shown in FIG. 9 and FIG. 10. Transverse magnetic fields in the same (one) direction (represented by lines of magnetic force 2 in FIG. 7 and FIG. 9) are also generated inside the bore portion 24 of the cryostat 17 by the pair of superconducting coils 27 and the multiple pairs of superconducting coils 28A and 28B.

As shown in FIG. 4, in the cryogenic refrigerator 20, a first cooling stage 21 is connected to the radiation shield 16 via a heat transfer plate 25. The radiation shield 16 is, for example, cooled to a cryogenic temperature around 40 K. A second cooling stage 22 is connected via a heat transfer plate 26 to superconducting coils 15, 27, or 28A and 28B. The superconducting coils 15, 27, or 28A and 28B are, for example, cooled to a cryogenic temperature around 4K. One or a plurality of the cryogenic refrigerators 20 is arranged on the refrigerator port 19 (a plurality (two) of the cryogenic refrigerators 20 is shown in FIG. 2). The current lead terminal 23 supplies a current to the superconducting coils 15, 27, or 28A and 28B.

Figure 5:
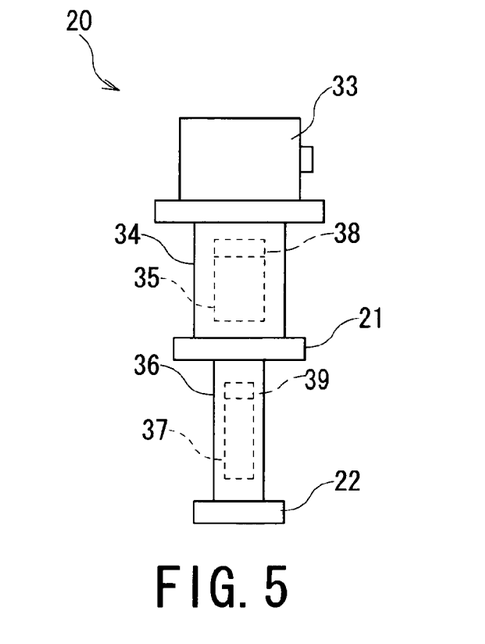
FIG. 5 is a side view that illustrates a cryogenic refrigerator shown in FIG. 3 and FIG. 4.
Figure 6:
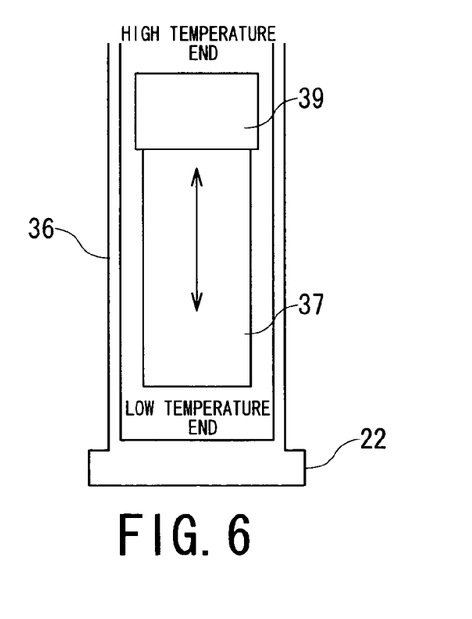
FIG. 6 is a sectional view that illustrates a second cylinder and a second displacer shown in FIG. 5.

As shown in FIG. 4 and FIG. 5, the cryogenic refrigerator 20 is a common type of refrigerator, in which the second cooling stage 22 is arranged below the first cooling stage 21, and a drive motor 33 is arranged at an uppermost portion. As shown in FIG. 5 and FIG. 6, according to this type of cryogenic refrigerator 20, a first displacer (first cold accumulating unit) 35 is housed inside a first cylinder 34 that has the first cooling stage 21 provided at the lower end thereof, and a second displacer (second cold accumulating unit) 37 is housed inside a second cylinder 36 that has the second cooling stage 22 provided at the lower end thereof.

The first displacer 35 and the second displacer 37 are moved reciprocally in the longitudinal direction (in this case, the vertical direction) of the respective cylinders. By means of the reciprocating movements of the first displacer 35 and the second displacer 37, a working fluid (for example, He gas), that is introduced between the lower end of the first cylinder 34 and the first displacer 35 and between the lower end of the second cylinder 36 and the second displacer 37, respectively, undergoes adiabatic expansion to obtain a predetermined refrigerating capacity.

As shown in FIG. 4, the refrigerator port 19 is arranged on the outer circumferential surface 18 of the cryostat 17 in an area between an upper end face 17A and a lower end face 17B of the cryostat 17. Further, the cryogenic refrigerator 20, the current lead terminal 23, the valve and the like that are mounted on the refrigerator port 19 are arranged within the aforementioned area between the upper end face 17A and the lower end face 17B of the cryostat 17.

More specifically, although the cryogenic refrigerator 20, the current lead terminal 23, and the valve and the like are inserted from an upper end face 19A side or lower end face 19B side of the refrigerator port 19 so as to be mounted thereon, portions that are exposed from the upper end face 19A and lower end face 19B at this time are arranged within an area between the upper end face 17A and lower end face 17B of the cryostat 17.

As a result, the refrigerator port 19 and exposed portions such as the cryogenic refrigerator 20, the current lead terminal 23, and the valve are prevented from protruding from the upper end face 17A and lower end face 17B of the cryostat 17.

Further, as shown in FIG. 3, the refrigerator port 19 is arranged in a magnetic field region in which modulation at the drive motor 33 (FIG. 5) of the cryogenic refrigerator 20 is not induced by a magnetic field generated by the superconducting coils 15, 27, or 28A and 28B. More specifically, in FIG. 3, FIG. 7 and FIG. 9, a reference character "X" denotes a boundary at which the intensity of the magnetic field is between 40 and 50 mT (millitesla). The refrigerator port 19, and particularly, the cryogenic refrigerator 20 mounted on the refrigerator port 19, is arranged in a magnetic field region W (region on the outer side of the boundary X) in which the intensity of the magnetic field is less than 40 to 50 mT. Consequently, the occurrence of modulation (including stopping) at the drive motor 33 of the cryogenic refrigerator 20 is avoided.

Thus, the cryogenic refrigerator 20 is provided in a region of the outer surface region of the cryostat 17 at which the intensity of a magnetic field generated by the superconducting coils 15 is weak. More specifically, the intensity of a magnetic field generated by the superconducting coils 15 disposed inside the cryostat 17 is weaker in the region of the outer surface of the cryostat 17 at which the cryogenic refrigerator 20 is provided than in other regions of the outer surface of the cryostat 17.

The boundary "X" at which the magnetic field intensity is between 40 and 50 mT as shown in FIG. 3, FIG. 7 and FIG. 9 is the intensity of a magnetic field at a central plane 29A at a central position in an axial direction (vertical direction) in the superconducting magnet device 10 shown in FIG. 4, FIG. 8 and FIG. 10.

Further, a reference character "Y" in FIG. 3, FIG. 7 and FIG. 9a denotes a boundary of an intensity of a magnetic field equivalent to the boundary X at planes 29B and 29C between the central plane 29A and the upper end face 17A and lower end face 17B of the cryostat 17, respectively, in the superconducting magnet device 10. Furthermore, a reference character "Z" in FIG. 3, FIG. 7 and FIG. 9a denotes a boundary of an intensity of a magnetic field equivalent to the aforementioned boundary "X" at planes 29D and 29E that include the upper end face 17A and lower end face 17B of the cryostat 17, respectively.

Thus, according to the superconducting magnet device 10, the intensities (for example, 40 to 50 mT) of equivalent magnetic fields have a similar shape on each plane in the vertical direction, and the magnetic field intensities decrease as the relevant planes are separated from the central plane 29A in the axial direction (vertical direction) of the superconducting magnet device 10.

The cryogenic refrigerator 20 is arranged outside (in magnetic field region W) the boundary "X" for which the magnetic field intensity is largest among the intensities between 40 and 50 mT, and therefore, is not exposed to a magnetic field with an intensity between 40 and 50 mT or more.

Accordingly, the following advantages (1) to (3) are obtained according to the present embodiment.

(1) The refrigerator port 19 including the cryogenic refrigerator 20, the current lead terminal 23, the valve and the like is arranged on the outer circumferential surface 18 of the cryostat 17 within an area between the upper end face 17A and lower end face 17B of the cryostat 17. Furthermore, the cryogenic refrigerator 20, the current lead terminal 23 and the valve are mounted on the refrigerator port 19 within an area between the upper end face 17A and lower end face 17B of the cryostat 17.

According to this arrangement, since the refrigerator port 19 and the exposed portions such as the cryogenic refrigerator 20, the current lead terminal 23 and the valve are not protruded from the upper end face 17A of the cryostat 17, the upper end face 17A of the cryostat 17 can be formed so as to provide a flat surface. Accordingly, interference between the single crystal pulling apparatus 11, in particular the pulling machine, and the superconducting magnet device 10 can be suppressed, and the workability and safeness in working of an operator operating at the upper end face 17A of the cryostat 17 can be improved.

(2) Furthermore, since the exposed portions such as the cryogenic refrigerator 20, the current lead terminal 23, and the valve do not project further downward from the lower end face 17B of the cryostat 17 and there are no protruding portions such as a leg portion on the lower end face 17B, the overall height dimensions of the superconducting magnet device 10 can be set to a low height level. As a result, it is possible to favorably secure a magnetic field adjustment margin for adjusting a magnetic field applied by the superconducting magnet device 10 by raising and lowering the superconducting magnet device 10.

(3) The cryogenic refrigerator 20 is of a type in which the first displacer 35 and second displacer 37 perform a reciprocating movement in the vertical direction inside the first cylinder 34 and the second cylinder 36, respectively, and in which the first displacer 35 and the second displacer 37 are vertically arranged in the first cylinder 34 and the second cylinder 36, respectively, by the action of gravity. Hence, the first displacer 35 and the second displacer 37 do not grind against each other to generate frictional heat.

Furthermore, in the cryogenic refrigerator 20, the seal portions 38 and 39 arranged at the upper portion of the first displacer 35 and the second displacer 37, respectively, do not press against one side of the inner circumferential surface of the first cylinder 34 and the second cylinder 36, respectively, so that the sealing property thereof is favorably maintained. As a result, in the cryogenic refrigerator 20, the refrigerating capacity can be suitably maintained and it is further possible to prevent an overload in the drive motor 33 due to the friction or the like, and also prevent the first displacer 35, the second displacer 37 and the seal portions 38 and 39 from damaging. Thus, the operating life and reliability of the cryogenic refrigerator 20 can be enhanced.

The first displacer 35 and the second displacer 37 have a thermal gradient such that, in an operating state, the upper end in the axial direction (vertical direction) thereof becomes a high temperature end and the lower end becomes a low temperature end. A working fluid (He gas or the like) that is introduced inside the first cylinder 34 and the second cylinder 36 similarly has a thermal gradient in the vertical direction such that the upper portion becomes a high temperature and the lower portion becomes a low temperature due to a density difference caused by the temperature.

With a longitudinally mounted-type cryogenic refrigerator 20, the direction of the aforementioned thermal gradient of the first displacer 35 and the second displacer 37 matches the direction of the thermal gradient of the working fluid. Hence, a heat exchange effect can be favorably maintained, and the refrigerating capacity of the cryogenic refrigerator 20 can be suitably ensured.

Further, the cryogenic refrigerator 20 is a type in which the first displacer 35 and the second displacer 37 perform a reciprocating movement in the vertical direction inside the first cylinder 34 and the second cylinder 36, respectively. Hence, at the time of performing maintenance to replace the first displacer 35 and the second displacer 37, by the action of gravity, the first displacer 35 and the second displacer 37 can be inserted concentrically with high precision into the first cylinder 34 and the second cylinder 36, respectively. Consequently, the workability of the maintenance operation can be enhanced and damage, which may be caused by a collision involving the first displacer 35, the second displacer 37, the first cylinder 34 or the second cylinder 36, can be prevented.

Figure 11:
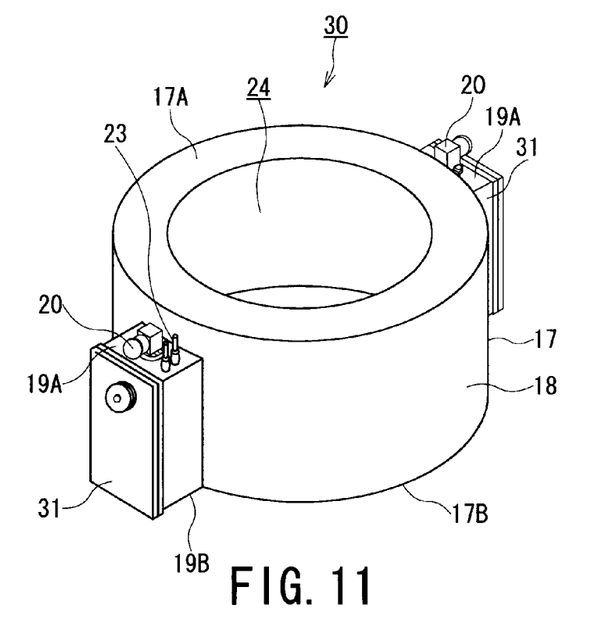
FIG. 11 is a perspective view that illustrates a second embodiment of the superconducting magnet device for a single crystal pulling apparatus according to the present invention.

SECOND EMBODIMENT (FIG. 11)

FIG. 11 is a perspective view that represents a second embodiment of the superconducting magnet device for a single crystal pulling apparatus according to the present invention. In the second embodiment, like reference numerals are added to portions or components similar to the first embodiment and the duplicated description thereof is simplified or omitted herein.

A superconducting magnet device for a single crystal pulling apparatus 30 of the present embodiment differs from the superconducting magnet device 10 of the first embodiment in the point that a plurality of the refrigerator ports 31 are arranged in a dispersed manner on the outer circumferential surface 18 of the cryostat 17. Further, one or a plurality of (one according to the present embodiment) the cryogenic refrigerator 20 is mounted on each refrigerator port 31.

Accordingly, in addition to the advantages similar to advantages (1) to (3) obtained with the first embodiment, the following advantage (4) is also obtained according to the present second embodiment.

(4) The refrigerator ports 31 on which the cryogenic refrigerator 20 is mounted are arranged in a dispersed manner on the outer circumferential surface 18 of the cryostat 17, and accordingly, the maximum heat-transfer distance per cryogenic refrigerator 20 can be decreased, for example, by half. As a result, the maximum temperature difference between the cryogenic refrigerator 20 and the superconducting coils 15, 27, or 28A and 28B can also be decreased, for example, by half. Hence, the superconducting coils 15, 27, or 28A and 28B inside the cryostat 17 can be cooled even more uniformly.

THIRD EMBODIMENT

Although a diagrammatic representation of a third embodiment is omitted herein, this embodiment is one in which a plurality of the refrigerator ports shown in FIG. 2 are provided, as shown in FIG. 11.

A superconducting magnet device for a single crystal pulling apparatus of the present third embodiment differs from the superconducting magnet devices 10 and 30 according to the first and second embodiments in the point that the refrigerator ports on which a plurality of the cryogenic refrigerators 20 are mounted are continuously arranged in an annular shape on the outer circumferential surface 18 of the cryostat 17. More specifically, the third embodiment is one in which a plurality of the refrigerator ports 19 shown in FIG. 2 are arranged on an outer circumferential surface of the cryostat 17 as shown in FIG. 11.

Accordingly, in addition to advantages similar to advantages (1) to (4) obtained with the first and second embodiments, the following advantage (5) is further obtained according to the present embodiment.

(5) Since the refrigerator ports are continuously arranged in an annular shape on the outer circumferential surface 18 of the cryostat 17, even when there is a large number of cryogenic refrigerators 20, it is not necessary to provide a large number of refrigerator ports. It is therefore possible to facilitate production of the superconducting magnet device and, since the material cost is reduced, the production cost of the superconducting magnet device can be also reduced.

Figure 12:
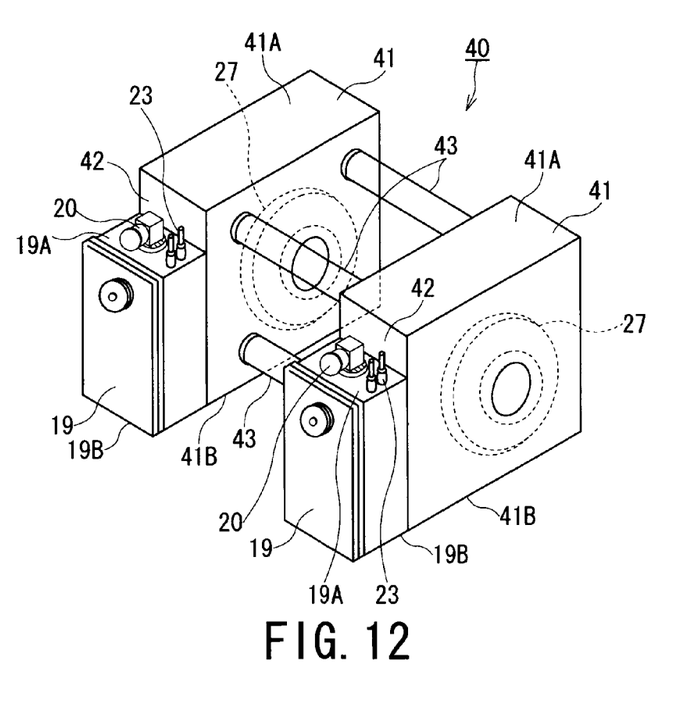
FIG. 12 is a perspective view that illustrates a third embodiment of the superconducting magnet device for a single crystal pulling apparatus according to the present invention.

FOURTH EMBODIMENT (FIG. 12)

FIG. 12 is a perspective view that represents a fourth embodiment of the superconducting magnet device for a single crystal pulling apparatus according to the present invention. In the fourth embodiment, like reference numerals are added to portions or components similar to those of the first embodiment, and the duplicated description thereof is simplified or omitted herein.

A superconducting magnet device for a single crystal pulling apparatus 40 of the present fourth embodiment differs from the superconducting magnet device 10 of the first embodiment in the point that the refrigerator port 19, on which the cryogenic refrigerator 20, the current lead terminal 23, and the valve are mounted, is arranged on an outer surface 42 of a split-type cryostat 41 having a rectangular parallelepiped shape.

More specifically, a plurality of the split-type cryostats 41 are arranged facing each other, and an interval between the respectively adjacent cryostats 41 is linked by adjustable support members 43. A superconducting coil 27 and a radiation shield 16 are enclosed inside each cryostat 41. The superconducting coil 27 and the radiation shield 16 are cooled to a cryogenic temperature by the cryogenic refrigerator 20. A unidirectional transverse magnetic field is generated by the superconducting coils 27 between the cryostats 41. The transverse magnetic field is applied to the pulling furnace 13 and the crucible 12 of the single crystal pulling apparatus 11 arranged between the cryostats 41.

The refrigerator port 19 is arranged on the outer surface 42 of each cryostat 41 so as to be within an area between the upper end face 41A and lower end face 41B of the cryostat 41. Further, exposed portions such as the cryogenic refrigerator 20, the current lead terminal 23 and the valve are arranged on the refrigerator port 19 so as to be within an area between the upper end face 41A and lower end face 41B of the cryostat 41. Furthermore, the refrigerator port 19 is arranged in a magnetic field region in which modulation at a drive motor of the cryogenic refrigerator 20 is not induced by a magnetic field generated by the superconducting coil 27 inside the cryostat 41.

Accordingly, advantages similar to the advantages (1) to (3) of the first embodiment are also obtained by the present fourth embodiment.

Although the present invention has been described in the hereinabove with reference to the embodiments, it is to be understood that the present invention is not limited to the above embodiments. For example, in the respective embodiments described above, there is described a case of a conduction cooling system, in which the superconducting coils 15, 27, or 28 inside the cryostat 17 or 41 are cooled to a cryogenic temperature by the cryogenic refrigerator 20 via the heat transfer plate 26. However, there may be adopted an immersion cooling system in which the superconducting coils 15, 27, or 28 are immersed in liquid helium that is filled in a coolant container inside the cryostat 17 or 41, and cooled to a cryogenic temperature by the cryogenic refrigerator 20.

The invention claimed is:

1. A superconducting magnet device for a single crystal pulling apparatus that is arranged outside a pulling furnace containing therein a crucible for melting a single crystal material so as to apply a magnetic field to the melted single crystal material, the superconductive magnet device comprising:

a cryostat that encloses a pair of superconducting coils arranged oppositely to each other with a predetermined magnetic field space being interposed therebetween to thereby generate a horizontal magnetic field;

a refrigerator port arranged on an outer surface of the cryostat; and a cryogenic refrigerator that cools the superconducting coil that is provided on the refrigerator port, wherein the cryogenic refrigerator is provided in a region of an outer surface region of the cryostat at which an intensity of a magnetic field generated by the superconducting coil is less than 100 mT.

2. The superconducting magnet device for a single crystal pulling apparatus according to claim 1, wherein the refrigerator port and the cryogenic refrigerator are arranged within an area between an upper end face and a lower end face of the cryostat outer surface.

3. The superconducting magnet device for a single crystal pulling apparatus according to claim 1, wherein the cryogenic refrigerator includes a drive motor, and the drive motor is arranged in a magnetic field region in which modulation is not induced by a magnetic field generated by the superconducting coils inside the cryostat.

4. The superconducting magnet device for a single crystal pulling apparatus according to claim 1, wherein the refrigerator port is arranged at a plurality of locations on the outer surface of the cryostat.

5. The superconducting magnet device for a single crystal pulling apparatus according to claim 4, wherein the refrigerator ports are continuously arranged on the outer surface of the cryostat.

6. The superconducting magnet device for a single crystal pulling apparatus according to claim 1, wherein the cryostat is a cylinder-shaped cylindrical cryostat.

7. The superconducting magnet device for a single crystal pulling apparatus according to claim 1, wherein the cryostat is a rectangular parallelepiped-shaped split-type cryostat.

8. The superconducting magnet device for a single crystal pulling apparatus according to claim 1, wherein the superconducting coils inside the cryostat are cooled to a cryogenic temperature by the cryogenic refrigerator via a heat transfer plate.

9. The superconducting magnet device for a single crystal pulling apparatus according to claim 1, wherein the superconducting coils inside the cryostat are immersed in liquid helium that is filled in a coolant container inside the cryostat so as to be cooled to a cryogenic temperature by the cryogenic refrigerator.

10. The superconducting magnet device for a single crystal pulling apparatus according to claim 1, wherein the superconducting coil is coils are a pair of saddle-shaped superconducting coils.

11. The superconducting magnet device for a single crystal pulling apparatus according to claim 1, wherein the superconducting coil is coils are a pair or a plurality of pairs of circular superconducting coils.

12. The superconducting magnet device or a single crystal pulling apparatus according to claim 1, wherein the intensity of a magnetic field generated by the superconducting coil is less than 40 mT to 50 mT.

* * * * *